(12) United States Patent
Lewis et al.

(10) Patent No.: US 8,497,790 B1
(45) Date of Patent: Jul. 30, 2013

(54) GAIN CALIBRATION

(75) Inventors: Donald E. Lewis, Nevada City, CA (US); Ryan James Kier, Salt Lake City, UT (US); Paul Talmage Watkins, Midvale, UT (US); Rex K. Hales, Riverton, UT (US); Yusuf Haque, Woodside, CA (US)

(73) Assignee: Crest Semiconductors, Inc., San Jose, CA (US)

( * ) Notice: Subject to any disclaimer, the term of this patent is extended or adjusted under 35 U.S.C. 154(b) by 0 days.

(21) Appl. No.: 13/424,671

(22) Filed: Mar. 20, 2012

(51) Int. Cl.
*H03M 1/10* (2006.01)

(52) U.S. Cl.
USPC .......................................... 341/120; 341/118

(58) Field of Classification Search
USPC .................. 341/118, 120, 121, 122, 155, 172, 341/131, 162, 156
See application file for complete search history.

(56) References Cited

U.S. PATENT DOCUMENTS 7,271,750 B1 * 9/2007 Ali et al. ........................ 341/118
7,928,884 B2    4/2011 Harper

* cited by examiner

*Primary Examiner* — Joseph Lauture
(74) *Attorney, Agent, or Firm* — Steven L. Nichols; Van Cott, Bagley, Cornwall & McCarthy P.C.

(57) ABSTRACT

A pipelined Analog-to-Digital Converter (ADC) includes circuitry to characterize capacitors associated with a Multiplying-Digital-to-Analog Converter (MDAC) of a stage of said pipelined ADC, said capacitors contributing to a gain of said pipelined ADC, circuitry to connect a subset of said capacitors not currently being characterized to reference signals of said pipelined ADC such that a residue signal of said stage stays within an input range of an instrument measuring said residue signal, circuitry to calculate said gain of said pipelined ADC using said capacitor characterizations, and an output adjusting component to digitally change an output of said pipelined ADC to compensate for said calculated gain.

20 Claims, 9 Drawing Sheets

Mode 1 (600)

Clock Cycles (606)

| | | 1 | 2 |
|---|---|---|---|
| Channel 0 (602) | A | S | HA |
| | B | HA | S |
| Channel 1 (604) | C | HP | HP |
| | D | HP | HP |

*Fig. 6A*

Mode 2 (608)

Clock Cycles (606)

| | | 1 | 2 |
|---|---|---|---|
| Channel 0 (602) | A | HP | HP |
| | B | HP | HP |
| Channel 1 (604) | C | S | HA |
| | D | HA | S |

*Fig. 6B*

Mode 3 (610)

Clock Cycles (606)

| | | 1 | 2 |
|---|---|---|---|
| Channel 0 (602) | A | S | HA |
| | B | HP | HP |
| Channel 1 (604) | C | HA | S |
| | D | HP | HP |

*Fig. 6C*

Mode 4 (612)

Clock Cycles (606)

| | | 1 | 2 | 3 | 4 |
|---|---|---|---|---|---|
| Channel 0 (602) | A | S | HA | HP | HP |
| | B | HP | HP | S | HA |
| Channel 1 (604) | C | S | HP | HA | HP |
| | D | HA | HP | S | HP |

Characterize capacitors associated with a Multiplying-Digital-to-Analog Converter (MDAC) of a stage of a pipelined ADC, the capacitors contributing to a gain of the pipelined ADC
(block 902)

Connect a subset of the capacitors not currently being characterized to reference signals of the pipelined ADC such that a residue signal of the stage stays within an input range of an instrument measuring the residue signal
(block 904)

Calculate the gain of the pipelined ADC using the capacitor characterizations
(block 906)

Digitally change an output of the pipelined ADC to compensate for the calculated gain
(block 908)

*Fig. 9*

GAIN CALIBRATION

BACKGROUND

Electronic devices typically make use of both analog and digital signals. An analog signal is a continuous signal which may assume any value. A digital signal is one which assumes one of a discrete set of values. A signal may be in the form of an electrical current or a voltage. Electronic circuitry often includes devices for transferring analog signals into digital signals and vice versa. For example, an Analog-to-Digital Converter (ADC) transfers analog signals into digital signals while a Digital-to-Analog Converter (DAC) transfers digital signals into analog signals.

One type of ADC is a pipelined ADC. A pipelined ADC uses a series of stages, each stage determining a sub-set of bits from the final digitized value. For example, a pipelined ADC may convert an analog signal into a sixteen-bit digital signal. The pipelined ADC may include four stages, each stage extracting four bits to add to the total digital word. The earlier stages extract the most significant bits while the later stages convert the least significant bits.

Each stage includes a sub-ADC to convert the appropriate number of bits from that stage. A sub-DAC is then used to create an analog version of the newly converted digital signal. This analog version of the newly converted digital signal is then subtracted from the original signal. The remaining signal, which is referred to as the residue signal, is then sent to subsequent stages for further processing.

BRIEF DESCRIPTION OF THE DRAWINGS

The accompanying drawings illustrate various examples of the principles described herein and are a part of the specification. The drawings are merely examples and do not limit the scope of the claims.

FIGS. 6A-6D are tables showing illustrative sampling modes, according to one example of principles described herein.

FIG. 9 is a flowchart showing an illustrative method for calibrating a pipeline stage of an ADC, according to one example of principles described herein.

Throughout the drawings, identical reference numbers designate similar, but not necessarily identical, elements.

DETAILED DESCRIPTION

Figure 1:
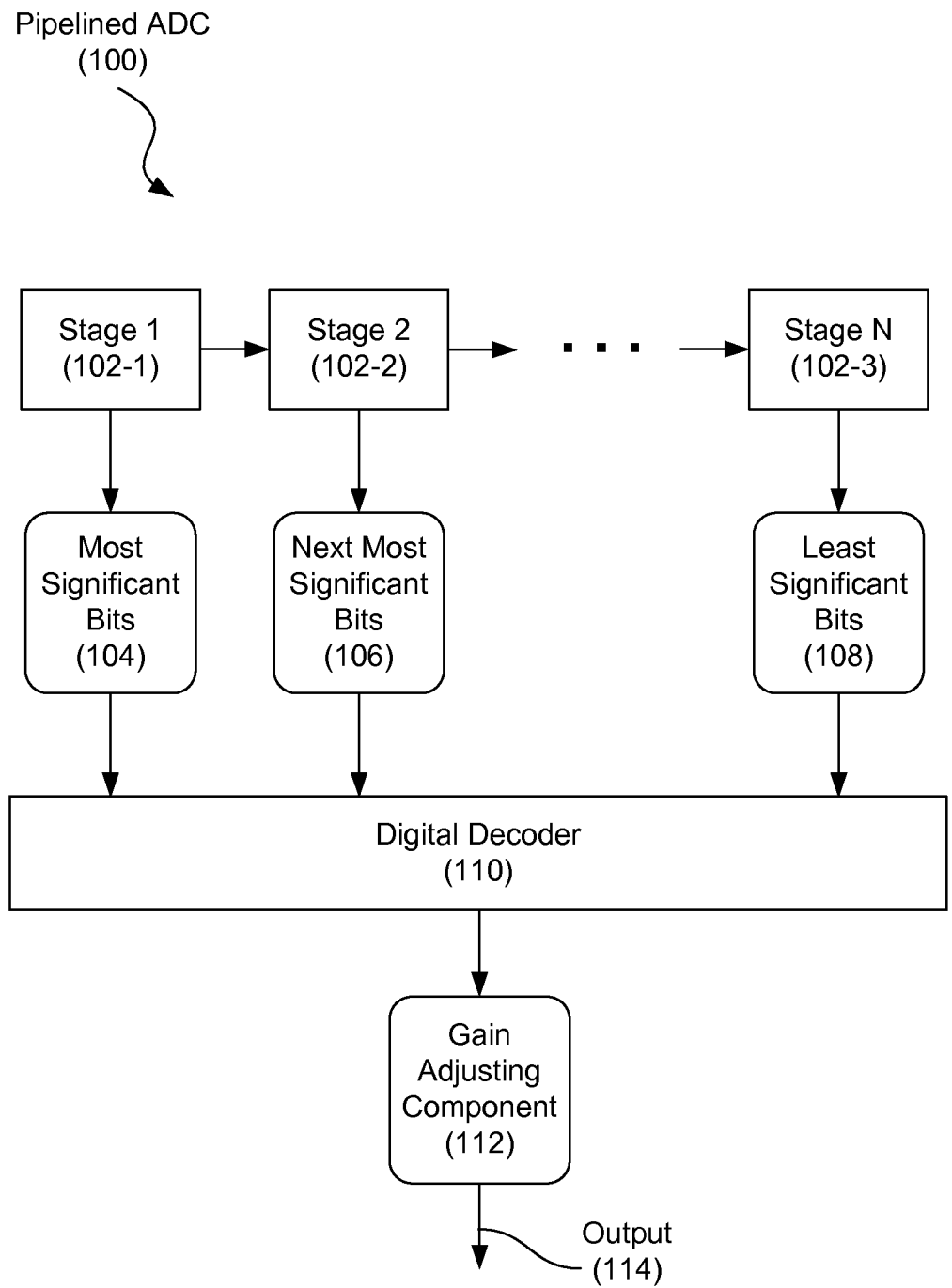
FIG. 1 is a diagram showing an illustrative pipelined ADC, according to one example of principles described herein.

As mentioned above, a stage within a pipelined ADC includes a sub-ADC to convert the appropriate number of bits from that stage. A sub-DAC is then used to create an analog version of the newly converted digital signal. This analog version of the newly converted digital signal is then subtracted from the original signal. The remaining signal, which is referred to as the residue signal, is then sent to subsequent stages for further processing. In some cases, amplification of the signals is used to bring those signals to appropriate levels.

The various components within a pipeline ADC stage have to be calibrated in order to work properly. Specifically, in a time interleaved pipelined ADC, there are conceptually two divided pipelined ADCs. The outputs of these two ADCs outputs are interleaved such that the two pipelined ADCs take turns sampling an input signal at consecutive intervals. It is important that both of these interleaved pipelined ADCs experience the same total signal gain when they are combined to form the final digital data stream that represents the sampled analog input. Otherwise, the pipelined ADC experiences performance issues. Thus, the time interleaved pipelined ADC has to undergo a calibration process.

Part of the calibration process involves adjusting the gain of the pipelined ADC to certain desired levels. In order to adjust the gain to the desired value, it is important to know what the present gain of the pipelined ADC is. To measure this gain, a known voltage would have to be connected to the input levels and then a measurement of the final digital output would be taken. This final digital output can then be compared to the expected digital output. The ratio of the measured digital value and the expected digital value indicates the gain error. Using this determined gain error, it is possible to digitally multiply the final digital output by a digital inverse of the gain error.

However, the only known voltages on the chip holding the pipelined ADC may be the reference voltages. Using the reference voltages as an input is not always possible because they may be outside the full-scale input range of that stage. For example, if subsequent pipeline stages are used to measure the gain, then the input to those subsequent stages must be within a specific range. Furthermore, it may not be cost efficient to add an additional known voltage supply for calibration purposes.

In light of this and other issues, the present specification discloses a method for gain calibration of a pipelined ADC stage that uses the reference signals of the pipelined ADC to determine the characteristics of each component that affects the gain. From those characteristics, it can be determined exactly what the gain of the pipelined ADC will be without actually having to directly measure the gain. Knowing the actual gain of the pipelined ADC allows for use of a gain multiplier to be set so that the overall gain of the pipelined ADC is brought to a desired level.

According to certain illustrative examples, the residue signal of the first pipeline stage is measured with only a single component connected to the reference signals. In one example, the components which contribute to the sub-DAC gain are the DAC capacitors, the dither capacitors, and feedback capacitors. The residue signal is measured with each of these capacitors connected to the reference signals separately. Additionally, other capacitors not being measured are connected or set such that the residue signal stays within range of the downstream pipeline stages used to measure that residue signal. After determining the characteristics of each capacitor, the gain for the pipelined ADC can be determined. The digital multiplier on the output of the pipelined ADC can then be set accordingly. This may be done even though the gain of downstream stages is unknown.

Through use of methods and systems embodying principles described herein, the overall gain of a pipelined ADC can be calibrated without the need for special measurement instruments and known supply voltages. Rather, the reference voltage signals and the downstream pipeline stages can be used for calibration purposes. This provides for a more efficient calibration process.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with that example is included as described, but may not be included in other examples.

Referring now to the figures, FIG. 1 is a diagram showing an illustrative pipelined ADC (100). As mentioned above, a pipelined ADC (100) includes a number of stages (102). Each stage is responsible for converting a subset of bits for the entire word length of bits used by the pipelined ADC (100). The first stage (102-1) of the pipelined ADC typically converts the most significant bits (104). The second stage (102-2) of the pipelined ADC (100) then converts the next most significant bits (106). This continues until the last stage (102-3) of the pipelined ADC (100) converts the least significant bits (108). At each stage, the converter bits are put into a digital decoder (110) that uses the entire word length of bits for processing. The output (114) of the digital decoder is thus a digital signal. The output (114) is connected to a gain adjusting component (112) that performs a digital multiplication on the digital output to compensate for the gain error.

Figure 2:
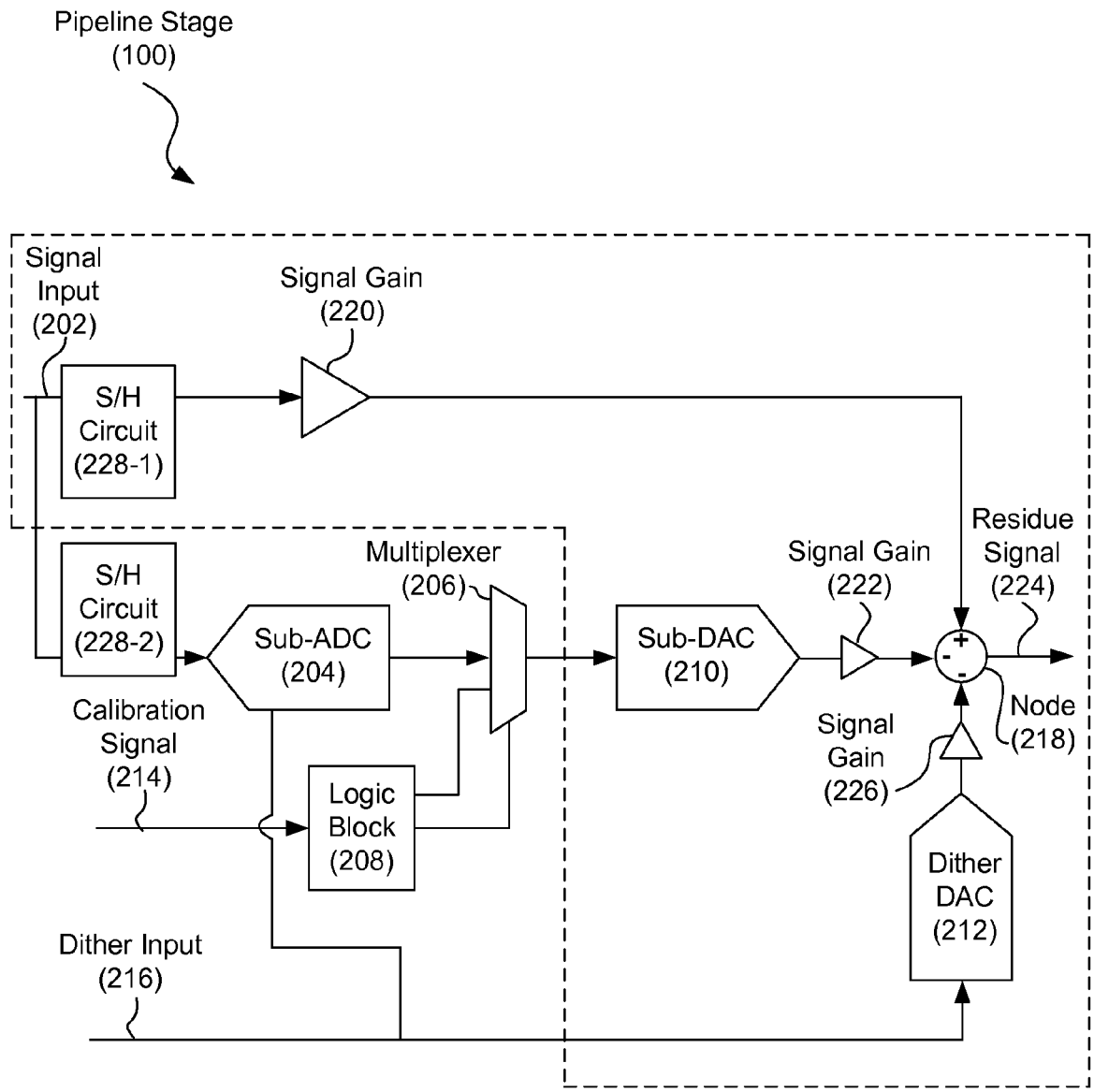
FIG. 2 is a diagram showing an illustrative pipelined ADC stage, according to one example of principles described herein.

FIG. 2 is a diagram showing an illustrative pipelined ADC stage (200). The diagram may represent either a single ended or a differential pipelined ADC stage. A differential ADC measures the value between two input signals rather than the value of a single input signal with respect to ground. The components within the diagram do not necessarily map to discrete components within an actual circuit.

According to certain illustrative examples, each stage includes sample and hold circuits (228), a sub-ADC (204), a sub-DAC (210), and a dither DAC (212). The pipelined ADC stage (200) may also include additional components used for calibration such as a logic block (208) and a multiplexer (206). The dotted line box includes components to be illustrated in further detail below with the text accompanying subsequent figures. The following will describe the operation of the pipelined ADC stage (200).

As an input signal is received by the pipeline stage (200), it is sampled by a sample and hold circuit (228). A sample and hold circuit (228) alternates between a sample mode and a hold mode. While in sample mode, the output of the sample and hold circuit (228) mode tracks the input of the sample and hold circuit (228). While in hold mode, the output maintains the value of the input signal at the moment in which the circuit (228) was switched to hold mode. The hold mode is long enough to allow processing of that signal by the other pipelined ADC stage (200) components and the sample and hold circuit in the next stage of the pipeline.

In the example of FIG. 2, the pipeline stage includes two sample and hold circuits. One sample and hold circuit (228-1) samples a signal for the main signal path and the other sample and hold circuit (228-2) samples the input signal for the sub-ADC path. The sub-ADC (204) may be a simple low resolution ADC designed to convert the received input signal (202) into a three or four bit value. In some cases, the sub-ADC (204) may be a flash ADC. Flash ADCs are able to operate at faster rates. However, they require the use of several comparator circuits. The output of the sub-ADC (204) is fed to the digital decoder (e.g. 110, FIG. 1) and into a sub-DAC (210).

The sub-DAC (210) may also be a low resolution device capable of a three or four bit digital input. The sub-DAC (210) then produces an analog output of the digitized signal from the sub-ADC (204). This analog signal will be slightly different than the input signal due to the lower resolution of the sub-ADC (204) and sub-DAC (210). The output of the sub-DAC (210) is then fed to the node (218) to be subtracted from the main sampled analog input signal sampled by the sample and hold circuit (228-1). The difference between the original input signal and the output of the sub-DAC (210) is referred to as the residue signal (224).

In some cases, the pipelined ADC stage (200) may make use of a dither DAC (212) to introduce dither into the residue signal. Dither is an added random noise used to randomize unwanted spurs caused by quantization and non-idealities within the ADC circuitry. The dither DAC introduces an analog version of this pseudo-random digital signal. This known pseudo-random signal is later removed by the digital decoder. A dither digital input signal (216) is fed into a dither DAC (212). The analog output of the dither DAC (212) is then fed to the node (218) to be added to the residue signal. The dither signal may also be introduced into the sub-ADC (204).

For calibration purposes, the input to the sub-DAC may be switched to a logic block (208) through use of a multiplexer (206). The logic signal entering the logic block (208) can allow the normal signal flow to be interrupted during calibration so that various calibration functions can be performed. The calibration process will be described in further detail below. The logic block (208) is controlled by a calibration signal (214).

For purposes of the subsequent stage, the residue signal (224) is often amplified. Both the sub-DAC (210) and the dither DAC (210) introduce a signal gain if those components use capacitors for the sampling operation. This gain is determined by the ratio of the sub-DAC capacitors to a set of feedback capacitors used within an amplifier feedback loop. The signal gain (220) is determined by the ratio of the capacitors that sample the input signal (sub-DAC (210), dither DAC (212), and feedback capacitors) to the capacitors used in an amplifier feedback loop. This feedback loop will be discussed further below. It is important that the signal gain (220) for the sub-DAC is of an appropriate value so that the residue signal (224) is an appropriate level for the next pipeline stage. If the residue signal is too far off the intended value, then error is introduced into the digital signal output from the pipelined ADC.

In some cases, the sample and hold circuit is not a discrete circuit. Rather, components within the sub-DAC (210) and dither DAC (212) perform the sample and hold functions. For example, the capacitors within the sub-DAC (210), dither DAC (212) may be used to store a voltage signal during the sample phase and maintain that value throughout the hold phase.

The circuit illustrated in FIG. 2 may be embodied as a switched capacitor circuit. Such circuits typically operate within two time periods to complete operation. The input signal is acquired (i.e., sampled) during the sample phase.

During the sample phase, the output of a switched cap circuit is not valid. During the hold phase, the sampled input signal is processed in some way to generate the output.

Many switched-capacitor circuits operate such that during one clock cycle, the circuit spends some time in the sample phase and some time in the hold phase. However, it is possible to duplicate switches and capacitors such that there is enough circuitry such that the sample and hold phases may overlap during the same clock cycle. Under this configuration, one set of capacitors would be configured in the sample phase for a complete cycle while simultaneously another set of capacitors could be configured in the hold phase. Therefore, the output of the circuit would be valid all of the time, with the exception of a very short period at the beginning/end of each clock cycle. Similarly, the input of the circuit would be connected to a set of capacitors for nearly a complete clock cycle.

Figure 3A:
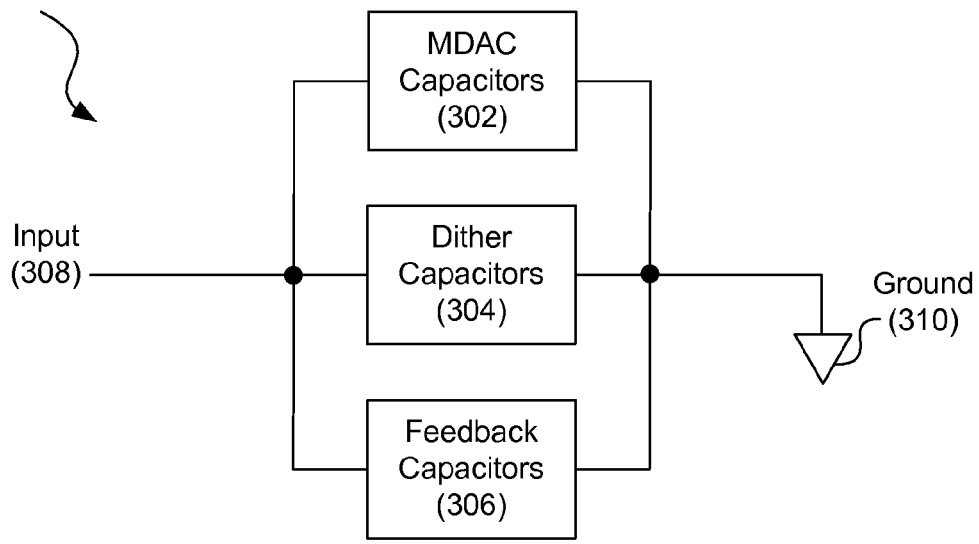
FIG. 3A is a diagram showing an illustrative sample phase schematic of part of a pipeline stage, according to one example of principles described herein.

FIG. 3A is a diagram showing an illustrative sample phase schematic of part of a pipeline stage. This circuit corresponds to the signal path components within the dotted line box of FIG. 2 that are active during the sample phase. Components within this box will be referred to as the MDAC. During the sample phase of the MDAC, the input simply charges the capacitors. There are three types of capacitors which contribute to the gain of the sub-DAC. The top plates (right side) of the MDAC capacitors (302), the dither capacitors (304), and the feedback capacitors (306) are all connected to ground (310) during the sample phase. In the case of a differential circuit, the capacitors are connected to common-mode.

Figure 3B:
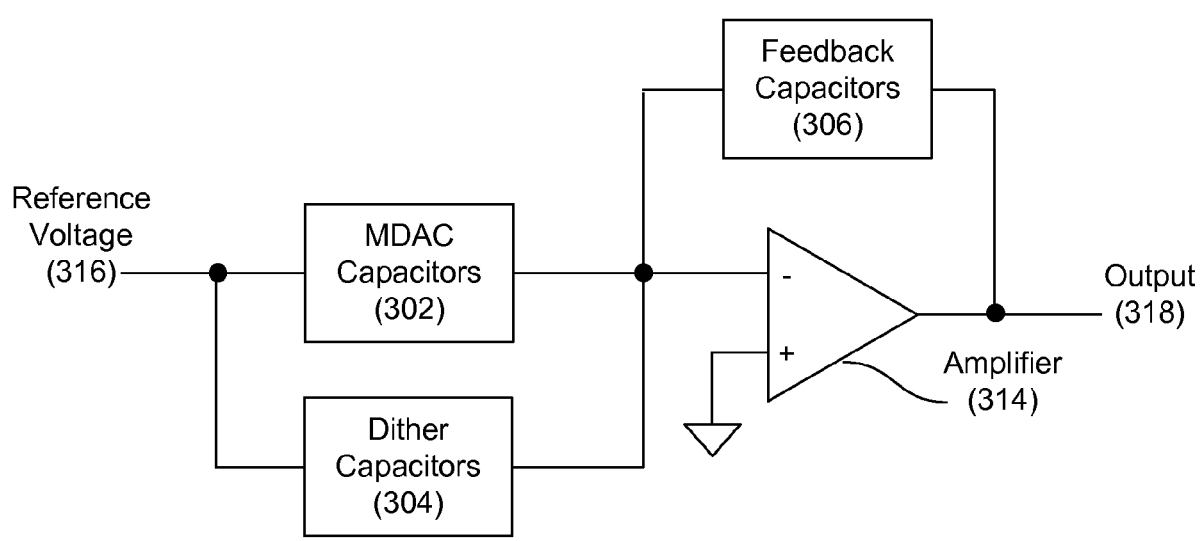
FIG. 3B is a diagram showing an illustrative hold phase schematic of part of a pipeline stage, according to one example of principles described herein.

FIG. 3B is a diagram showing an illustrative hold phase schematic of part of a pipeline stage. This circuit corresponds to the signal path components within the dotted line box of FIG. 2 that are active during the hold phase. In the hold phase, the top plates of the MDAC capacitors (302), the dither capacitors (304), and the feedback capacitors (306) are now connected to the inputs of the amplifier (314). The bottom plates of the feedback capacitors (306) are connected to the amplifier output (318) to create a feedback loop. Additionally, the bottom plates of the MDAC capacitors (302) and the dither capacitors (304) are connected to the reference voltages (316).

The MDAC determines the residue signal by combining the sampled charge that was stored during the sample phase with the sampled charge from the reference voltage sampled during the hold phase. The effective reference voltage can be varied between the positive reference voltage and the negative reference voltage in discreet steps by varying the number of capacitors connected to the positive and negative reference voltages during the hold phase. The difference in these two charges is then stored across the feedback capacitors. Thus, the switched capacitor circuit performs the function of the sample and hold circuits (228), sub-DAC (210), and dither DAC (212) of FIG. 2.

To determine the gain of such a switched capacitor circuit, each of the capacitors is characterized. The ratio of the MDAC capacitors (302) and dither capacitors (304) to the feedback capacitors (306) indicates the gain. The following equation describes how the gain can be determined:

$$VOUT = \frac{\sum_{n=1...NS}^{NS} C_n * V_n + \sum_{n=1...NH}^{NH} C_n * (-1)^{(d_n+1)} * VREF}{\sum_{n=1...NFB}^{NFB} C_n} \quad \text{(Equation 1)}$$

Where:
VOUT=the measured output voltage of the stage;
Cn=the size of the nth capacitor;
dn=the state of the nth bit of the thermometer encoded sub-ADC output or dither output code;
Vn=the sampled input signal;
VREF is the ADC reference voltage;
NS=the number of capacitors used to sample the input signal (all capacitors in above example)
NH=the number of capacitors used to sample the reference voltage during the hold phase (DAC and dither capacitors in above example);
NFB=the number of capacitors used in the feedback loop.

In the case of implementations different from the one illustrated above, additional summing terms would be used to reflect the use of different capacitors to sample the input signal or reference voltage. Equation 1 describes the transfer characteristic of the pipeline ADC stage. The signal path gain of the stage is the change in VOUT divided by the change in Vn. This gain gets multiplied by the unknown gains of the downstream stages to determine the overall gain of the pipelined ADC from the initial input to final output.

Figure 4:
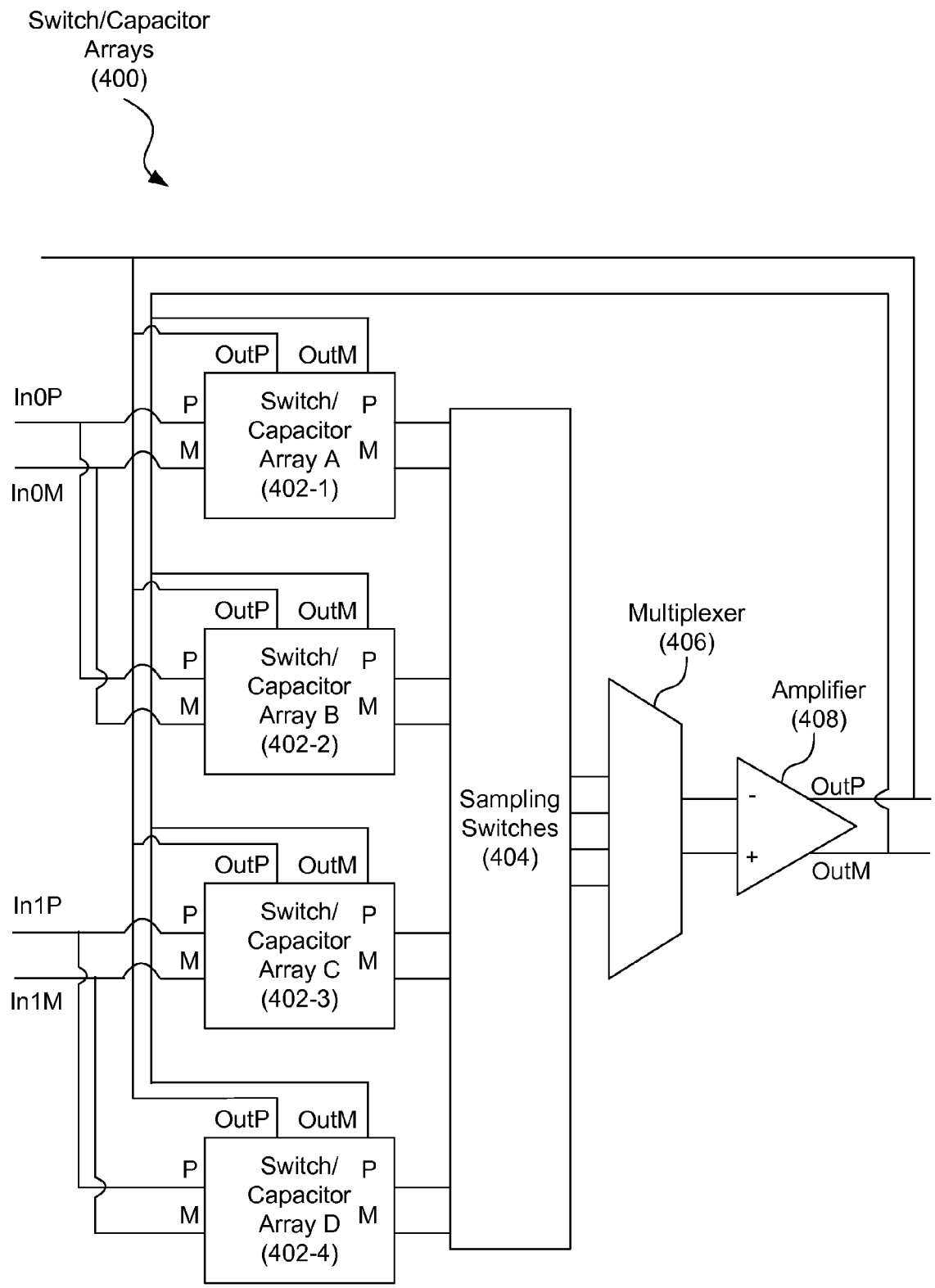
FIG. 4 is a diagram showing an illustrative schematic of a set of switch and capacitor arrays of a DAC, according to one example of principles described herein.

FIG. 4 is a diagram showing an illustrative schematic of a set of switch and capacitor arrays of a DAC. A particular pipelined ADC may be designed with multiple channels and time interleaved components. Doing so allows the pipelined ADC to process more bits at a faster rate. In the example of FIG. 4, the sub-DAC operates on two channels. FIG. 4 illustrates how four different switched capacitor arrays can be multiplexed to share a single operational amplifier (408). For simplicity, the details of the switched capacitor arrays (402) such as illustrated in FIG. 3 are not shown.

Each channel includes two time interleaved sub-DACs. According to certain illustrative examples, the first channel interleaves between the A array (402-1) and the B array (402-2). Thus, the A array (402-1) and the B array (402-2) are connected to the same inputs. The second channel interleaves between the C array (402-3) and the D array (402-4). Thus, the C array (402-3) and the D array (402-4) are connected to the same inputs. Each array is connected to a set of sampling switches (404). The sampling switches (404) are used to connect the top plates of the capacitors to the proper voltages as described above. The sampling switches (404) are also connected to a multiplexer (406). The multiplexer (406) allows each of the arrays to use the same amplifier (408). This is done by switching the top plates of the capacitors to the amplifier (408) inputs at the appropriate times. During a given clock cycle, only one of the arrays is able to use the amplifier (408). Circuits in FIG. 4 are also shown as differential circuits. A given capacitor array includes the MDAC capacitors, dither capacitors, and feedback capacitors used to perform the functions of the sub-DAC.

When using time-interleaved ADCs, each different capacitor array may contribute to the overall gain of the pipelined ADC in a different manner. Thus, it is important that the digital correction for the gain error be specific for each channel. Otherwise, the interleaved pipelined ADC may be subject to inter-modulation distortion. By characterizing the components that contribute to the overall gain of the pipelined ADC for each different capacitor array, an efficient and dynamic interleaved pipelined ADC may be achieved.

Figure 5:
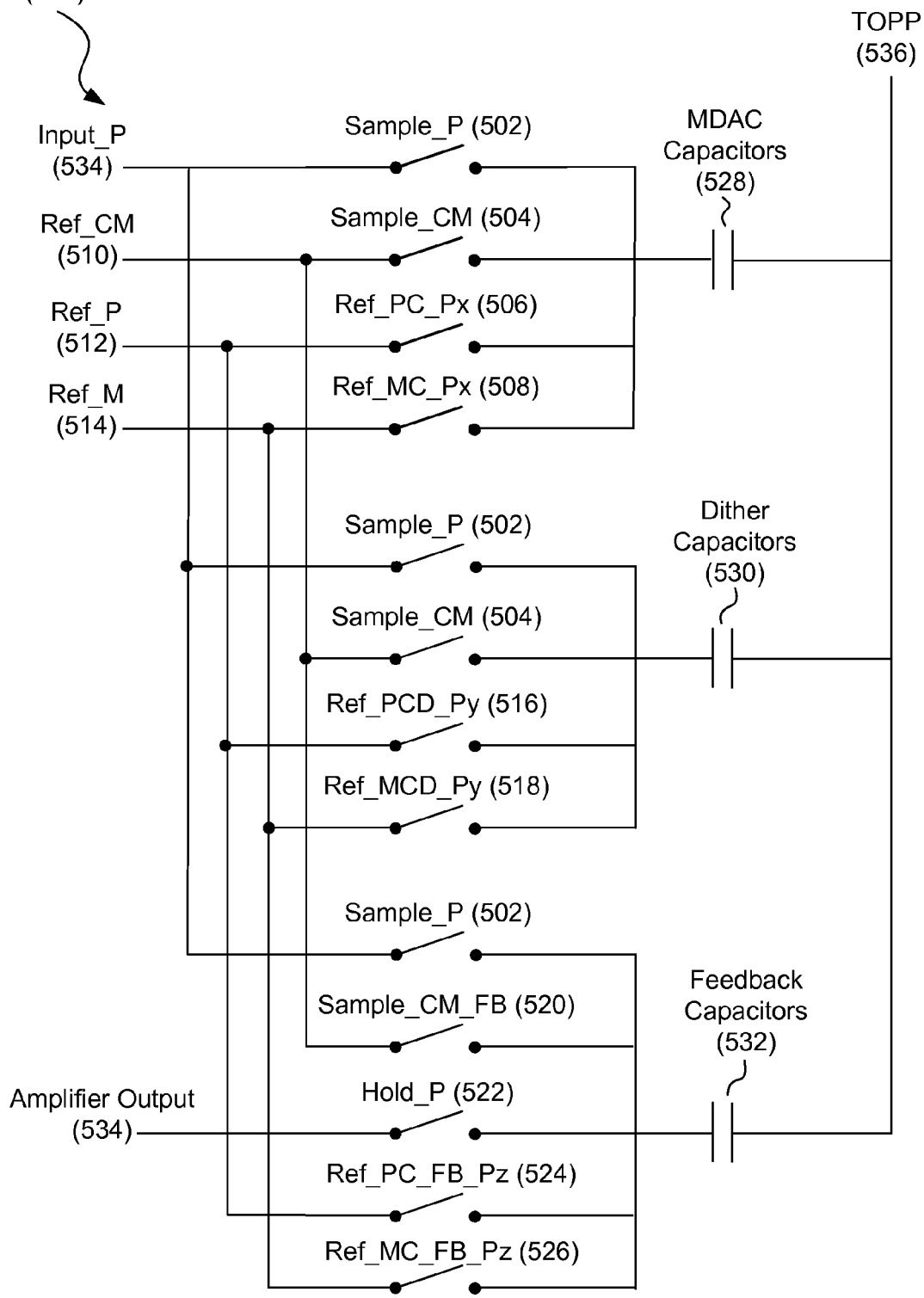
FIG. 5 is a diagram showing an illustrative schematic of a capacitor array of a DAC, according to one example of principles described herein.

FIG. 5 is a diagram showing an illustrative schematic of a capacitor array of a sub-DAC. According to certain illustrative examples, FIG. 5 illustrates one half (the p-side) of a fully differential capacitor switch array such as (402-1 through 402-4) in FIG. 4. Each capacitor array is subdivided into three groups: the MDAC capacitors (528), the dither capacitors (530), and the feedback capacitors (532). The bottom plates (left side) of each of those capacitor groups are connected to several switches. These switches are controlled by various control signals. The switches connect the bottom plates of the capacitor to various signals.

All three capacitor groups have switches controlled by the Sample_P signal (502). The Sample P control signal is used only during normal operation to connect the capacitors to the input_P signal (534). During calibration, the Sample_CM (504) and Sample_CM_FB (520) signals are used to connect the capacitors to a special common-mode voltage that is halfway between the two reference voltages Ref_P (512) and Ref_M (514). In a differential implementation, when this voltage is sampled, it is equivalent to sampling 'zero' because the difference between the p-side and m-side is zero. When the MDAC capacitors (528) and the dither capacitors (530) are being characterized, the Sample_CM (504) and Sample_CM_FB (520) signals cause zero differential charge to be stored on all of the capacitors during the sample phase. During the hold phase, the calibration logic controls the Ref_PC_Px (506), Ref_MC_Px (508), Ref_PCD_Py (516), and Ref_MCD_Px (518) such that the size of each capacitor may be ascertained. During normal operation, these reference control signals are controlled by the sub-ADC codes and the dither codes.

The feedback capacitors (532) are treated slightly differently. The feedback capacitors (532) use an additional switch and control signal Hold_P (522). During both normal and calibration operation, this Hold_P signal connects the bottom-plates of the feedback caps to the operational amplifier output. However, during the sample phase, the bottom plates of the feedback capacitors may be connected to either the reference voltages via the Ref_PC_FB_Pz switch (524) and Ref_MC_FB_Pz switch (526), the input signal via the Sample_P switches (502), or the reference common-mode voltage via the Sample_CM_FB switches (520). During normal operation, only the Sample_P signal is used for the feedback capacitors. During calibration either the Sample_CM_FB (520) or the Ref_PC_FB_Pz/Ref_MC_FB_Pz switches (524/526) may be used. The Sample_CM_FB switches (520) are used while characterizing the MDAC capacitors (528) and the dither capacitors (530).

The Ref_PC_FB_Pz/Ref_MC_FB_Pz switches (524/526) are used when characterizing the feedback capacitors. This means that the 'Vin' term in the MDAC defining equation (Equation 1) is actually set to +Vref for some of the feedback caps, −Vref for the remainder of the feedback caps, and 0 for all of the DAC and Dither DAC caps. By sampling the individual feedback capacitors to the reference voltages in a particular sequence of combinations, it is possible to compute the appropriate ratio for each of the feedback caps that provides the final gain.

FIGS. 6A-6D are tables showing illustrative sampling modes. Using the example above in which there are two channels, each channel including two time interleaved capacitor arrays, different sampling modes may be achieved. The rows correspond to the capacitor arrays shown in FIG. 4. The columns correspond to clock cycles (606). The cells denote one of three different states. An 'S' indicates the sample mode where the capacitors are being charged to match the input signal. An "HP" indicates a hold passive state where the switches connected to the capacitors are open and thus the capacitors hold the value stored therein at the time of switching. An "HA" indicates a hold active state where the capacitors holding a value are connected to the amplifier as well as the reference signals. During this stage, the residue signal produces an output to be processed by subsequent pipeline stages.

FIG. 6A is a table (600) showing a sample mode that uses only one of the channels. Channel 0 (602) is the first channel and channel 1 (604) is the second channel. In this mode, the channel 1 (604) capacitors are in the HP state the entire time while the A array and the B array alternate between the S phase and the HA phase for channel 0 (602).

FIG. 6B is a table (608) showing a sample mode that uses only the other channel. In this mode, the channel 0 (602) capacitors are in the HP state the entire time while the C array and the D array alternate between the S phase and the HA phase for channel 1 (604). FIG. 6C is a table (610) showing a sample mode that alternates between the two channels (602, 604). FIG. 6D is a table (612) showing a sample mode in which both of the channels are used simultaneously. FIGS. 6A-6D do not illustrate an exhaustive list of possible sampling modes.

Figure 7:
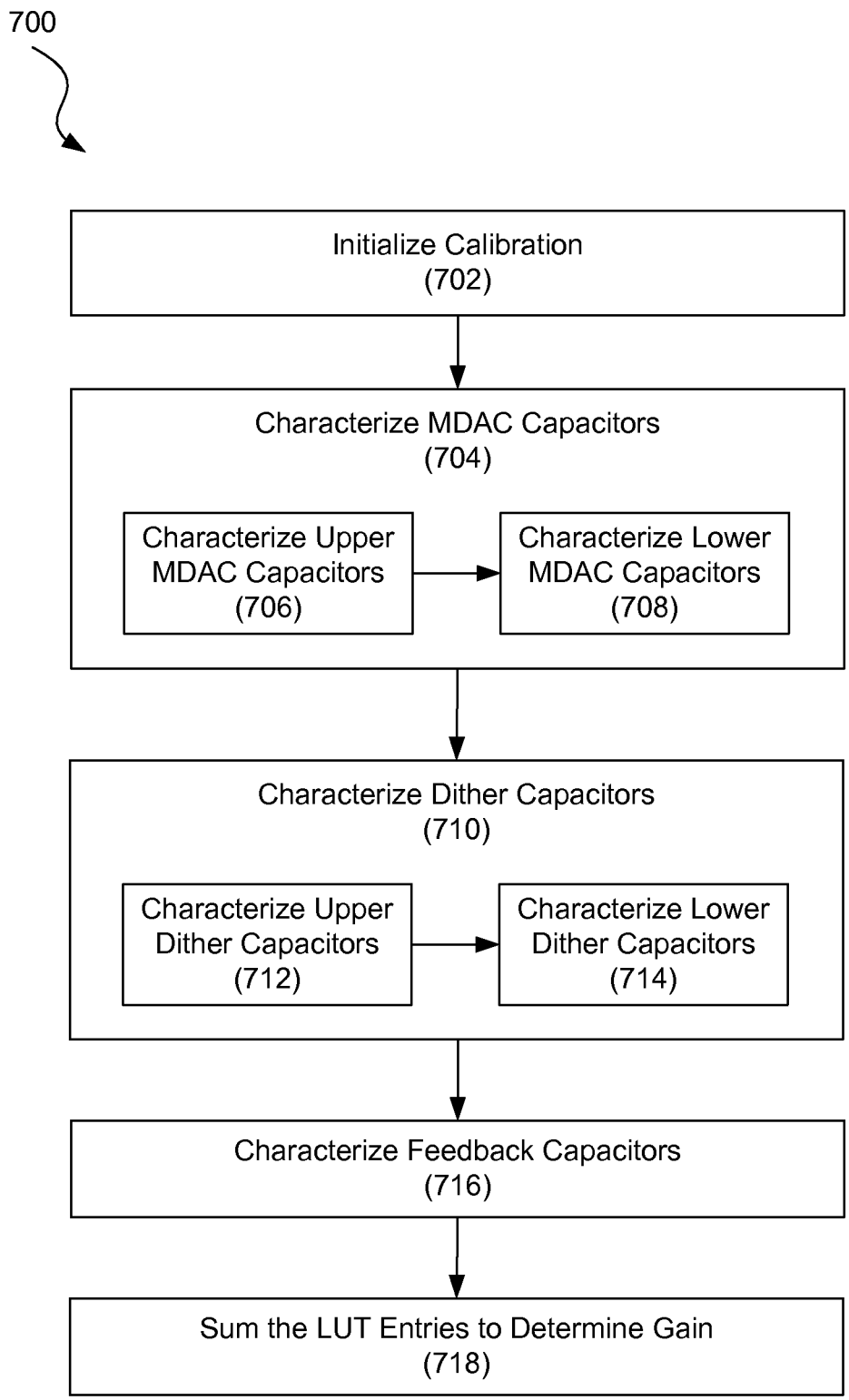
FIG. 7 is a flowchart showing an illustrative method for measuring components that contribute to the gain of a sub-DAC, according to one example of principles described herein.

FIG. 7 is a flowchart showing an illustrative method for characterizing the components that affect the gain of a pipelined ADC. The following description illustrates the calibration process for an early stage or first stage of a differential pipelined ADC that uses a dither DAC.

According to certain illustrative examples, the method starts with a calibration initialization (702) process. The initialization process involves several preliminary steps. The common-mode level is sampled while the sub-DAC is in sample mode. During the hold phase, the upper MDAC capacitors are connected to the positive reference signal and the lower MDAC capacitors are connected to the negative reference signal. Additionally, the upper dither DAC capacitors are connected to the positive reference signal and the lower dither DAC capacitors are connected to the negative reference signal. With the capacitors connected as such, the downstream pipeline stages can be used to measure the residue signal. The measured value is then negated and added to an offset trim value. The offset trim value indicates a known offset for the stage and may be stored in a memory register. The sum of the negated value and the offset trim value is then stored in a middle DAC Lookup Table (LUT) entry of an MDAC LUT. A MDAC LUT is one that is designated to hold characterization values for the MDAC capacitors. The value stored in the middle MDAC LUT entry cancels out the offset value of the stage being calibrated.

Figure 8:
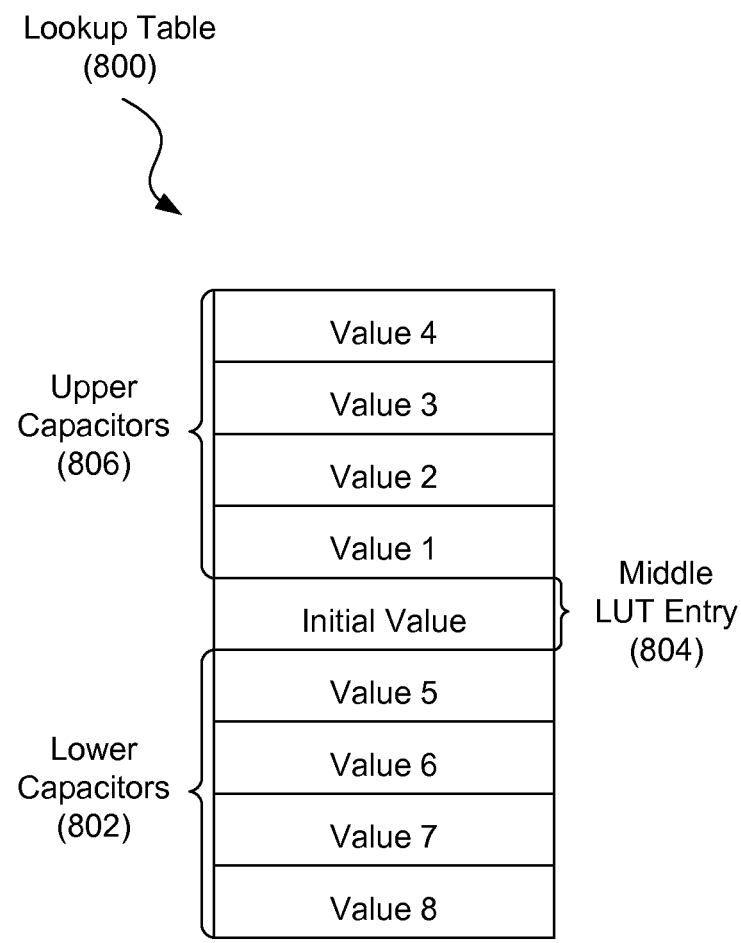
FIG. 8 is a diagram showing an illustrative DAC lookup table entry, according to one example of principles described herein.

FIG. 8 is a diagram showing an illustrative LUT entry. This LUT is used to store the values measured during the calibration process. Thus, the text accompanying the flowchart of FIG. 7 will refer to FIG. 8 as well. The middle LUT entry (804) is where the initial value measured during the initialization process (702) is stored. Subsequent measurements will be stored adjacent to the most recent measurements as will be described in more detail below.

Returning to FIG. 7, with the offset stored in the middle LUT entry (804), the process proceeds by characterizing the MDAC capacitors. First, the upper MDAC capacitors are characterized (706). While characterizing the upper MDAC capacitors, the lower dither capacitors are connected to the positive reference signal. This offsets the residue signal by −½ of the Least Significant Bit (LSB) size for the stage being calibrated so that the upper MDAC capacitor step sizes can be measured within the input range of the downstream pipeline stages. In the case that the pipelined ADC does not use dither DACs, another mechanism may be used to offset the residue signal.

Working upwards through the upper MDAC capacitors, starting with the upper MDAC capacitor closest to the middle, each of the upper MDAC capacitors is individually characterized. A capacitor currently being characterized will be referred to as the selected capacitor. The residue signal is first measured while the selected MDAC capacitor is connected to the negative reference signal. This may be done several times to get an average value. Then, the residue signal is measured while the selected MDAC capacitor is connected to the positive reference signal. This may also be done several times to get an average value. The difference between the two values measured is then added to the previously written MDAC LUT entry. In the case of the first upper MDAC capacitor, the previous value will be the initial value stored in the middle MDAC LUT entry. The sum of the previous value and the difference calculated earlier is then stored in the next highest MDAC LUT entry for the upper capacitors (806). This process proceeds through each of the upper MDAC capacitors until the MDAC LUT entries corresponding to upper capacitors (806) are filled.

After the upper MDAC capacitors are characterized, the lower MDAC capacitors are characterized (708). To do this, both the upper dither DAC capacitors and the lower dither DAC capacitors are connected to the negative reference signal. This offsets the residue signal by +½ the LSB size in order to keep the residue signal in range while the lower MDAC capacitors are measured by the downstream pipeline stages.

The lower MDAC capacitors are then characterized starting with the lower MDAC capacitor closest to the middle. The residue signal is measured while the selected lower MDAC capacitor is connected to the positive reference signal and then the negative reference signal. The difference between those two values are then subtracted from the previously entered MDAC LUT entry and stored in the next lowest MDAC LUT entry for the lower capacitors (802). In the case of the first lower MDAC capacitor, the middle MDAC LUT entry (804) acts as the previously entered MDAC LUT entry. The measured value numbers in FIG. 8 illustrate the order in which entries are placed into the MDAC LUT in the case that there are four upper capacitors (806) and four lower capacitors (802).

To characterize the dither capacitors (710), the upper dither capacitors are characterized (712) followed by the characterization (714) of the lower dither capacitors. To characterize the upper dither capacitors, the upper MDAC capacitors are connected to the positive reference signal and the lower MDAC capacitors are connected to the negative reference signal. A different LUT is used to store values measured from the dither capacitors. The LUT corresponding to the dither capacitors will be referred to as the dither LUT. The dither LUT has its middle LUT entry hardcoded as zero. The dither LUT entries for the upper capacitors (806) are then filled by measuring the residue signal with the selected dither capacitor connected to the positive reference signal and then the negative signal. The difference between these values is then added to the previously entered dither LUT entry and stored in the corresponding dither LUT entry for the upper capacitors (806).

The same process is done for each of the lower dither capacitors. However, the difference between the residue signal while the selected dither capacitors is connected to the positive reference signal and the negative reference signal is subtracted from the previously entered dither LUT entry before being stored in the corresponding entry for the lower capacitors (802).

After characterizing the MDAC capacitors and the dither capacitors, the feedback capacitors are characterized (716). The feedback capacitors are measured by connecting each feedback capacitor to the positive reference signal and then the negative reference signal while the stage is in sample mode. The difference of these two values is then stored in a corresponding feedback LUT entry. In some cases, a feedback LUT entry is not used. Rather, a simple sum of all the measured values is stored within a memory location such as a register. If a lower feedback capacitor is selected, then the dither DAC capacitors are connected to the positive reference signal in the hold phase. If an upper feedback capacitor is selected, then the dither capacitors are connected to the negative reference signal. This is done to keep the residue signal in range during the measurements.

With each of the capacitors in the first stage being characterized, the differences between the top and bottom LUT values from the MDAC LUT, the dither LUT, and the feedback capacitor sum are added together. This total sum can then be used to determine the gain of the overall pipelined ADC. This sum represents what the value would be if the residue signal was measured with the input connected to the positive reference signal minus the residue signal measured while the input was connected to the negative reference signal. The calculated value can then be compared to an ideal value that would be expected if all of the components were ideal. The ratio between the calculated value and the ideal value is used to determine the gain of the pipelined ADC.

Knowing this gain, a gain adjustment component can be set to use a gain multiplier value that will cause the final digital output to be at the appropriate value. This gain multiplier causes the pipelined ADC to digitally compensate for the gain error as normal input signals are put through the ADC. The gain adjusting component is placed on the output of a digital decoder for the pipelined ADC stage. The overall gain of the pipelined ADC may be adjusted in different ways. In an absolute gain calibration, the overall gain is set to match a predetermined value. In a relative gain calibration, the overall gain for a sample processed by one capacitor array is adjusted to match the overall gain for a sample processed by a different capacitor array. For example, the overall gain of a sample processed by array A is matched to array B. Likewise, the overall gain of a sample processed by array C is matched to an overall gain of a sample processed by array D.

FIG. 9 is a flowchart showing an illustrative method for calibrating a pipeline stage of an ADC. According to certain illustrative examples, the method includes characterizing (block 902) capacitors associated with a Multiplying-Digital-to-Analog Converter (MDAC) of a stage of the pipelined ADC, the capacitors contributing to a gain of the pipelined ADC, connecting (block 904) a subset of the capacitors not currently being characterized to reference signals of the pipelined ADC such that a residue signal of the stage stays within an input range of an instrument measuring the residue signal, calculating (block 906) the gain of the pipelined ADC using the capacitor characterizations, and digitally changing (block 908) an output of the pipelined ADC to compensate for the calculated gain.

In conclusion, through use of methods and systems embodying principles described herein, the overall gain of a pipelined ADC can be calibrated without the need for special measurement instruments and known supply voltages. Rather, the reference voltage signals and the downstream pipeline stages can be used for calibration purposes. This provides for a more efficient calibration process.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A pipelined Analog-to-Digital Converter (ADC), comprising:
    circuitry to characterize capacitors associated with a Multiplying-Digital-to-Analog Converter (MDAC) of a stage of said pipelined ADC, said capacitors contributing to a gain of said pipelined ADC;
    circuitry to connect a subset of said capacitors not currently being characterized to reference signals of said pipelined ADC such that a residue signal of said stage stays within an input range of an instrument measuring said residue signal;
    circuitry to calculate said gain of said pipelined ADC using said capacitor characterizations; and
    an output adjusting component to digitally change an output of said pipelined ADC to compensate for said calculated gain.

2. The ADC of claim 1, wherein said circuitry is further configured to store measured values of said residue signal in a memory element corresponding to a group of capacitors being characterized.

3. The ADC of claim 1, wherein said instrument comprises downstream pipeline stages.

4. The ADC of claim 1, wherein said capacitors comprise Multiplying-DAC (MDAC) capacitors, dither capacitors, and feedback capacitors.

5. The ADC of claim 4, wherein said circuitry is further configured to:
    connect a first subset of MDAC capacitors and a first subset of dither capacitors to a positive reference signal;
    connect a second subset of MDAC capacitors and a second subset of dither capacitors to a negative reference signal; and
    update a memory element for said MDAC capacitors based on a measurement of said residue signal.

6. The ADC of claim 5, wherein said circuitry is further configured to:
    with said second subset of dither capacitors connected to said positive reference signal, for each of said first subset of MDAC capacitors, update said memory element for said MDAC capacitors based on a measured difference of said residue signal with a selected one of said first subset of MDAC capacitor connected to said positive reference signal and said negative reference signal; and
    with said second subset of dither capacitors connected to said negative reference signal and said first subset of dither capacitors connected to said positive reference signal, for each of said second subset of MDAC capacitors, update said memory element for said MDAC capacitors based on a measured difference between said residue signal with a selected lower MDAC capacitor connected to said positive reference signal and said negative reference signal.

7. The ADC of claim 6, wherein said circuitry is further configured to:
    with said first subset of MDAC capacitors connected to said positive reference signal and said second subset of MDAC capacitors connected to said negative reference signal, for each of said first subset of dither capacitors, update a memory element for said dither capacitors based on a measured difference between said residue signal with a selected first subset of dither capacitor connected to said positive reference signal and said negative reference signal; and
    for each of said second subset of dither capacitors, update said memory element for said dither capacitors based on a measured difference between said residue signal with a selected second subset of dither capacitor connected to said positive reference signal and said negative reference signal.

8. The ADC of claim 7, wherein said circuitry is further configured to:
    with the dither capacitors connected to said positive reference signal, update a memory element for feedback capacitors based on a measured difference between said residue signal when a selected second subset of feedback capacitor is connected to said positive reference signal and said negative reference signal; and
    with the dither capacitors connected to said negative reference signal, update said memory element for feedback capacitors based on a measured difference of said residue signal when a selected first subset of feedback capacitor is connected to said positive reference signal and said negative reference signal.

9. The ADC of claim 8, wherein said circuitry is further configured to use values within said memory elements to determine a gain of said pipelined ADC.

10. The ADC of claim 1, wherein said output adjusting component comprises a digital multiplier to multiply a digital output of said pipelined ADC.

11. The ADC of claim 1, wherein said output adjusting component is configured to digitally correct the overall gain of said pipelined ADC for each time-interleaved capacitor array of said pipelined ADC separately.

12. A method for calibrating a pipelined Analog-to-Digital Converter (ADC), the method comprising:
    characterizing capacitors associated with a Multiplying-Digital-to-Analog Converter (MDAC) of a stage of said pipelined ADC, said capacitors contributing to a gain of said pipelined ADC;
    connecting a subset of said capacitors not currently being characterized to reference signals of said pipelined ADC such that a residue signal of said stage stays within an input range of an instrument measuring said residue signal;
    calculating said gain of said pipelined ADC using said capacitor characterizations; and
    digitally changing an output of said pipelined ADC to compensate for said calculated gain.

13. The method of claim 12, further comprising, storing measured values of said residue signal in a memory element corresponding to a group of capacitors being characterized.

14. The method of claim 12, wherein said capacitors comprise Multiplying-DAC (MDAC) capacitors, dither capacitors, and feedback capacitors.

15. The method of claim 14, further comprising:
    connecting a first subset of MDAC capacitors and a first subset of dither capacitors to a positive reference signal;
    connecting a second subset of MDAC capacitors and a second subset of dither capacitors to a negative reference signal; and
    updating a memory element for said MDAC capacitors based on a measurement of said residue signal.

16. The method of claim 15, further comprising:
    with said second subset of dither capacitors connected to said positive reference signal, for each of said first subset of MDAC capacitors, updating said memory element for said MDAC capacitors based on a measured difference of said residue signal with a selected one of said first subset of MDAC capacitor connected to said positive reference signal and said negative reference signal; and
    with said second subset of dither capacitors connected to said negative reference signal and said first subset of dither capacitors connected to said positive reference signal, for each of said second subset of MDAC capacitors, updating said memory element for said MDAC capacitors based on a measured difference between said residue signal with a selected lower MDAC capacitor connected to said positive reference signal and said negative reference signal.

17. The method of claim 16, further comprising:

with said first subset of MDAC capacitors connected to said positive reference signal and said second subset of MDAC capacitors connected to said negative reference signal, for each of said first subset of dither capacitors, updating a memory element for said dither capacitors based on a measured difference between said residue signal with a selected first subset of dither capacitor connected to said positive reference signal and said negative reference signal; and for each of said second subset of dither capacitors, updating said memory element for said dither capacitors based on a measured difference between said residue signal with a selected second subset of dither capacitor connected to said positive reference signal and said negative reference signal.

18. The method of claim 17, further comprising:

with the dither capacitors connected to said positive reference signal, updating a memory element for feedback capacitors based on a measured difference between said residue signal when a selected second subset of feedback capacitor is connected to said positive reference signal and said negative reference signal; and with the dither capacitors connected to said negative reference signal, updating said memory element for feedback capacitors based on a measured difference of said residue signal when a selected first subset of feedback capacitor is connected to said positive reference signal and said negative reference signal.

19. The method of claim 18, further comprising using values within said memory elements to determine a gain of said pipelined ADC.

20. A pipelined Analog-to-Digital Converter (ADC), comprising:

circuitry to characterize capacitors associated with a Multiplying-Digital-to-Analog Converter (MDAC) of a stage of said pipelined ADC, said capacitors contributing to a gain of said pipelined ADC;

circuitry to connect a subset of said capacitors not currently being characterized to reference signals of said pipelined ADC such that a residue signal of said stage stays within an input range of downstream pipeline stages;

circuitry to calculate said gain of said pipelined ADC using said capacitor characterizations; and a digital multiplier to digitally change an output of said pipelined ADC to compensate for said calculated gain.

* * * * *